United States Patent [19]

Gordon

[11] Patent Number: 4,990,286
[45] Date of Patent: Feb. 5, 1991

[54] ZINC OXYFLUORIDE TRANSPARENT CONDUCTOR

[75] Inventor: Roy G. Gordon, Cambridge, Mass.

[73] Assignee: President and Fellows of Harvard College, Cambridge, Mass.

[21] Appl. No.: 324,808

[22] Filed: Mar. 17, 1989

[51] Int. Cl.$^5$ .................. C01B 11/24; C04B 35/02; H01B 1/06
[52] U.S. Cl. .................. 252/518; 252/501.1; 423/472; 423/473; 501/151
[58] Field of Search .................. 252/518, 501.1; 423/107, 622, 473, 472; 501/151; 502/343

[56] References Cited

U.S. PATENT DOCUMENTS

| | | | |
|---|---|---|---|
| 2,695,214 | 11/1954 | Sherwood | 423/472 |
| 2,934,537 | 4/1960 | Cislak | 502/343 |
| 3,051,569 | 8/1962 | Sugarman | 252/501.1 |
| 3,555,102 | 1/1971 | Ogura | 502/343 |
| 4,592,904 | 6/1986 | Bielecki et al. | 423/472 |
| 4,751,149 | 6/1988 | Vijayaknmar et al | 428/702 |

FOREIGN PATENT DOCUMENTS 0020237  12/1980  France .

OTHER PUBLICATIONS

T. Chu, Abstract from Energy Res., No. 12689 (Electrochemical Radiational, and Thermal Energy Technology), Thin Film Cadmium telluride and zinc phosphide solar cells (Oct. 1984)

Primary Examiner—Paul Lieberman
Assistant Examiner—John Boyd
Attorney, Agent, or Firm—Choate, Hall & Stewart

[57] ABSTRACT

Transparent, electrically conductive and infrared-reflective films of zinc oxyfluoride are produced by chemical vapor deposition from vapor mixtures of zinc, oxygen and fluorine-containing compounds. The substitution of fluorine for some of the oxygen in zinc oxide results in dramatic increases in the electrical conductivity. For example, diethyl zinc, ethyl alcohol and hexafluoropropene vapors are reacted over a glass surface at 400° C. to form a visibly transparent, electrically conductive, infrared reflective and ultraviolet absorptive film of zinc oxyfluoride. Such films are useful in liquid crystal display devices, solar cells, electrochromic absorbers and reflectors, energy-conserving heat mirrors, and antistatic coatings.

22 Claims, 2 Drawing Sheets

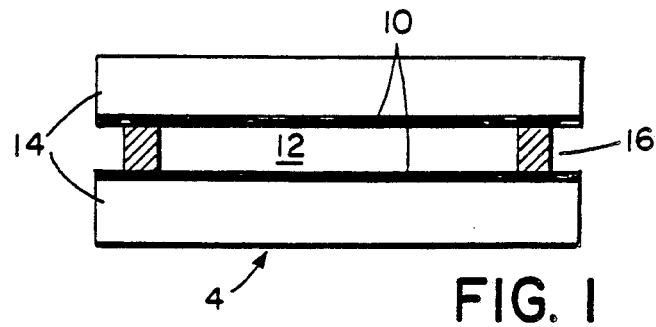
FIG. 1
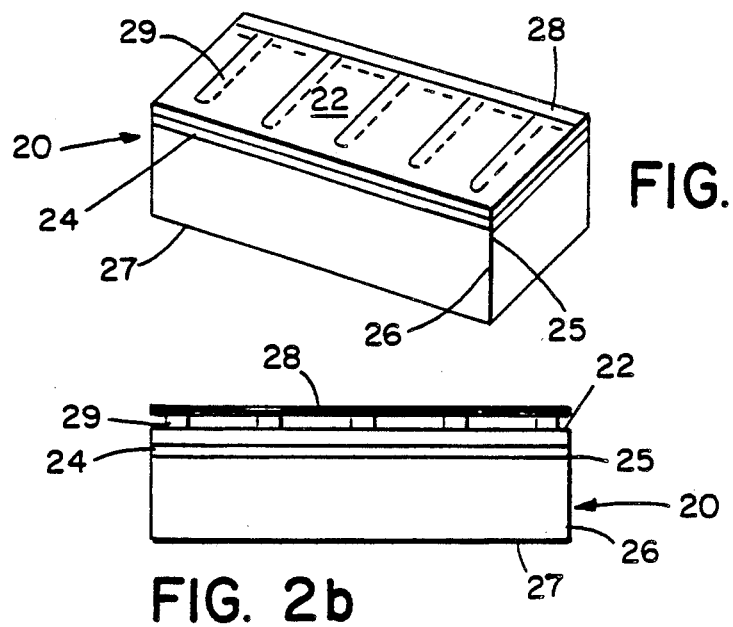
FIG. 2a
FIG. 2b
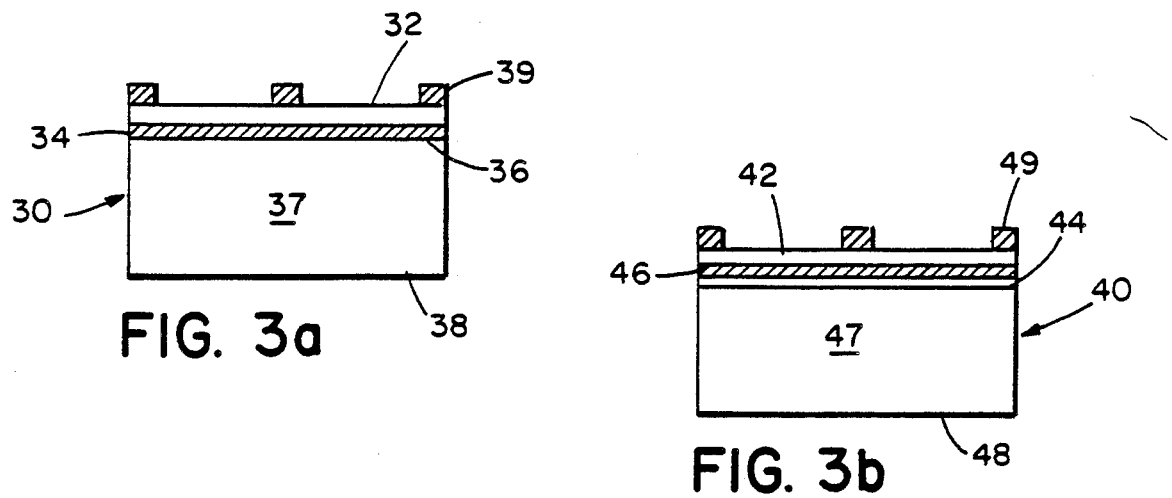
FIG. 3a
FIG. 3b

ZINC OXYFLUORIDE TRANSPARENT CONDUCTOR

The U.S. Government has rights to this invention based upon funding by the Department of Energy, SERI Award Number XX8-18148-1.

BACKGROUND OF THE INVENTION

The present invention relates to transparent, electrically conductive and infrared reflective films.

Films satisfying these requirements are known in the art, and can be prepared from several different materials. One class of such transparent conducting films includes zinc, oxygen and one or more of the group III elements: boron, aluminum, gallium and indium. U.S. Pat. No. 4,751,149 to Vijayakumar et al. discloses a chemical; vapor deposition method for producing group III doped zinc oxides. Among these, a zinc-boron oxide film composition displays the lowest electrical resistance. Vijayakumar et al. deposit this film by mixing vapors of dialkyl zinc, diborane and water at low pressure near a substrate heated at 100°–200° C. Deposition rates for this process are, however, fairly low, only up to about 1 nanometer per second, and expensive vacuum chambers and pumping equipment are needed to maintain the low pressure. Such group III doped films prepared according to the teachings of this patent have resistivities of less than $2.5 \times 10^{-3}$ ohm-centimeter.

SUMMARY OF THE INVENTION

According to the invention, a compound having high visible transparency, high electrical conductivity, high infrared reflectivity, and high ultraviolet absorption has the formula $ZnO_{1-x}F_x$. It is preferred that x be in the range of 0.001–0.1. Highest electrical conductivity is achieved for x in the range of 0.002 to 0.02. Highest infrared reflectivity is achieved for x in the range 0.005 to 0.01.

In a preferred process for making the compound of the invention, a vapor mixture of a zinc containing compound, an oxygen containing compound, and a fluorine containing compound is prepared and exposed to a heated substrate to deposit a film of the compound on the substrate. Suitable zinc bearing vapors include volatile dialkyl zinc compounds such as diethyl zinc and dimethyl zinc. Suitable oxygen bearing vapors include volatile alcohols, water, and oxygen. Fluorine containing vapors include volatile fluorides of non-metals such as fluorocarbons and nitrogen trifluoride. Here, the term "volatile" designates a compound which is readily vaporized at a relatively low temperature. The process is conducted at atmospheric pressure eliminating the need for vacuum chambers and vacuum pumps. The process is suited for high speed production. Furthermore, the material is readily etched into desired patterns using dilute aqueous acids such as hydrochloric acid and conventional methods, such as photoresists or tape to mask areas not to be removed.

The high visible transparency, electrical conductivity, and ultraviolet absorption of the films of this invention well suit them for use in liquid crystal display devices, solar cells, electrochromic absorbers and reflectors, energy conserving heat mirrors, and anti-static coatings. In particular, device applications include improved and less expensive liquid crystal display devices such as computer displays and television screens; electrochromically adjustable mirrors and windows with a transparent electrode which simultaneously protects the device from damage by ultraviolet radiation in sunlight; and improved and less expensive transparent electrodes which simultaneously function as an antireflection coating for solar cells.

BRIEF DESCRIPTION OF THE DRAWING

In the drawing:

FIG. 1 is a cross sectional view of a liquid crystal display device incorporating a transparent, conductive coating of $ZnO_{1-x}F_x$.

FIG. 2a is a perspective view of a p-n junction solar cell incorporating a $ZnO_{1-x}F_x$ transparent electrode.

FIG. 2b is a sideview of a p-n junction solar cell incorporating a $ZnO_{1-x}F_x$ transparent electrode.

FIG. 3a is a sideview of a Schottky barrier solar cell incorporating a $ZnO_{1-x}F_x$ transparent electrode.

FIG. 3b is a sideview of a metal-insulator semiconductor (MIS) solar cell incorporating a $ZnO_{1-x}F_x$ transparent electrode.

DESCRIPTION OF THE PREFERRED EMBODIMENTS

Figure 4:
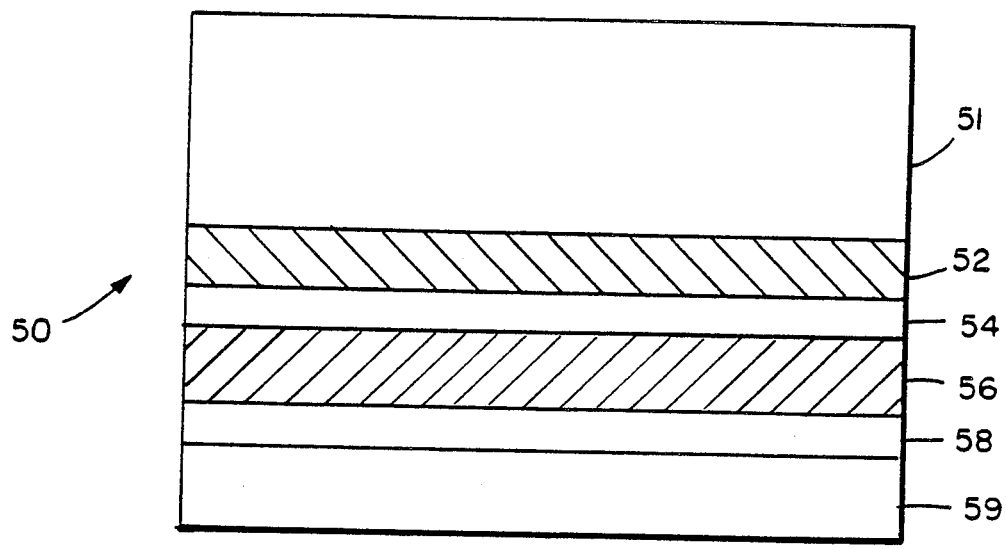
FIG. 4 is a sideview of a thin film solar cell grown on a glass superstrate.

Pure zinc oxide, ZnO, is known to be a material with low electrical conductivity (high resistance). The new composition of matter of the current invention is based on the discovery that substitution of fluorine for some of the oxygen in zinc oxide dramatically increases the electrical conductivity. As little as one tenth atomic per cent fluorine produces high conductivity. The highest conductivity is attained for fluorine contents specifically within the range of one half to four atomic per cent. Outside these limits, conductivity begins to decrease, e.g., when the fluorine content is increased above about five atomic per cent. Thus, compositions between one half to two atomic per cent fluorine are most preferred for applications requiring high conductivity. When the material is to be used for its high infrared reflectivity (low emittance), the most preferred composition is between one half to one atomic per cent fluorine.

Zinc oxyfluoride materials of this invention can be formed into useful films by any of the processes known in the art, including evaporation, sputtering, reactive sputtering, plasma induced chemical vapor deposition, photo-induced chemical vapor deposition, molecular beam epitaxy, spray pyrolysis, or spin-coating. However, formation of zinc oxyfluoride films by chemical vapor deposition at atmospheric pressure (APCVD) is simple and can be carried out rapidly using commercial belt furnaces.

In a preferred APCVD process of the invention, diethyl zinc vapor is mixed with an inert gas such as helium or nitrogen by bubbling the inert gas through liquid diethyl zinc. Similarly, ethyl alcohol vapor is mixed with an inert gas and with hexafluoropropene gas as a fluorine source. These two gas mixtures are combined at about one atmosphere total pressure, and then flow over the surface of a glass substrate heated to 400°

C., on which a film of transparent, electrically conductive, infrared reflective zinc oxyfluoride is deposited. The concentration of the fluorine-containing gas, hexafluoropropene, is adjusted to optimize the conductivity or the reflectivity of the film. That is, for example, the hexafluoropropene concentration is adjusted so that the fluorine content in the resulting film is in the range of 0.5 to 2.0 atomic percent for high conductivity or in the range of 0.5 to 1.0 atomic percent for high infrared reflectivity. The fluorine content of the film generally increases with increasing concentration of the fluorine-containing gas in the gas mixture.

The substrate is heated sufficiently to induce the deposition reactions for the particular reactants chosen. For the preferred reactants diethylzinc, ethyl alcohol and hexafluoropropene, the required temperatures are generally in the range 350° C. to 500° C., and more preferably 400° C. to 450° C. Such temperatures are low enough to avoid warpage of polished flat soda-lime glass substrates for use with liquid crystal displays. If other, more thermally sensitive, substrates are used, then the preferred reactants should be selected to exhibit appreciable reactivity at low temperatures. For example, amorphous silicon substrates which should not be heated above about 250° C., can be coated by replacing the ethanol with more reactive tert-butanol, or with still more reactive water vapor while substrate temperature is maintained no higher than 150° C.

In a preferred embodiment for carrying out the invention, the substrates are pre heated as they travel along a belt furnace. Then they pass through a coating zone in which the reactant gas mixture flows over the substrate surface, reacting and depositing a uniform coating.

Many other fluorine-containing gases are suitable as fluorine sources in the APCVD process, including trifluoromethyl iodide, trifluoromethyl nitrite, hexafluoropropylene oxide, hexafluoroacetone, and nitrogen trifluoride. However, hexafluoropropene is preferred, since its use has resulted in the most conductive and uniform films. Certain acidic fluorine-containing gases, such as trifluoroacetic acid, hydrofluoric acid and carbonyl fluoride, tend to cause etching of the film or glass substrate during deposition, and are not suitable for producing uniform films.

Small amounts of carbon, hydrogen and other impurities have been found in the films made by the APCVD process. However, it is believed that these impurities do not have a major influence on the properties of the films.

The films are easily etched by dilute mineral acids, such as 1 molar hydrochloric acid. Use of photoresist masking, as practiced in the production of semiconductor microcircuits, allows etching of fine lines and patterns needed in display devices.

EXAMPLE 1

A flow of 0.5 liters/min of helium gas is passed through a bubbler of liguid diethyl zinc, $(CH_3CH_2)_2Zn$, held at 25° C. The resulting diethyl zinc vapor in helium is then diluted with a flow of 5.5 liter/min of pure helium to form gas mixture A. A separate flow of 1 liters/min of helium is directed through a bubbler of anhydrous ethanol held at 60° C. This flow of ethanol vapor in helium is diluted with 5 liters/min of helium and 0.02 liters/min of hexafluoropropene gas to form gas mixture B. Gas mixtures A and B are mixed at the entrance to a heated channel 1 cm high by 10 cm wide. On the bottom of this channel rests a soda-lime glass plate 10 cm × 10 cm, heated to a temperature of about 400° C., while the upper surface of the channel is held at a temperature of about 300° C. After the gases pass over the glass substrate, they go through a scrubber and exit to the atmosphere. The pressure inside the deposition region is approximately atmospheric pressure. After a deposition time of about 3 minutes, the gas flow is switched to pure helium, and thereafter the glass plate is removed from the apparatus.

The glass plate has a transparent film whose composition is approximately $ZnO_{.99}F_{.01}$. Its thickness is about 400 nm, it has an electrical resistance of 15 ohms per square, an electrical resistivity of $6 \times 10^{-4}$ ohm-centimeter, measured at room temperature and an infrared reflectance of about 84%, measured at 8 micron wavelength, visible transparency of about 80%, and absorption of ultraviolet light with wavelengths shorter than 340 nanometer.

EXAMPLE 2

The gas flow conditions of example 1 are repeated, with the gases flowing into a commercial belt furnace designed for atmospheric pressure chemical vapor deposition. Suitable belt furnaces are sold by the Watkins-Johnson Company, Scotts Valley, California, and by BTU Engineering, Billerica, Massachusetts. A uniform film is formed on substrates as they pass through the furnace with properties similar to those measured in example b 1.

The $ZnO_{1-x}F_x$ films deposited and patterned according to the method of the invention are an integral component of several electronic devices whose fabrication is known in the art. In a preferred embodiment for a liquid crystal display device 4 (see FIG. 1), a transparent, conductive $ZnO_{1-x}F_x$ coating 10 contacts a liquid crystal film 12 which is confined between glass plates 14 separated by a spacer 16.

$ZnO_{1-x}F_x$ films may be used as a combined transparent electrode and antireflection coating in a solar cell 20 shown in FIGS. 2a and 2b. The cell shown represents a silicon p n Junction embodiment; however, utility of these $ZnO_{1-x}F_x$ electrodes is not limited to p-n junction solar cells and they may be applied to a Schottky barrier solar cell 30, a metal-insulator-semiconductor (MIS) solar cell 40 as shown in FIGS. 3a and 3b, and thin film solar cell 50 as shown in FIG. 4.

In the p-n junction solar cell 20, a $ZnO_{1-x}F_x$ film 22 serves as both a transparent front electrode contact and as an antireflective coating covering a layer of n-type silicon 24. The active region of the p-n junction solar cell 20 is a p-n junction 25 formed where the n-type silicon 24 and a layer of p-type silicon 26 meet. A back electrode contact 27 consists of an opaque conductor. A metallic bus bar 28 and fingers 29 collect current from the $ZnO_{1-x}F_x$ film.

In a Schottky barrier solar cell 30 (FIG. 3a) a $ZnO_{1-x}F_x$ film 32 serves as a transparent electrode and also as an antireflective coating covering a layer of a semitransparent metal 34. The active region of this device is the Schottky barrier created at an interface 36 between the layer of semitransparent metal 34 and a semiconductor 37 (e.g. silicon). A back electrode contact 38 consists of an opaque conductor. Metallic electrodes 39 collect the current from the $ZnO_{1-x}F_x$ film 32.

In an MIS solar cell 40 (FIG. 3b) a $ZnO_{1-x}F_x$ film 42 serves as a transparent front electrode and also as an antireflective coating. This device 40 operates on the same principle as the Schottky barrier solar cell 30; however, an oxide film layer 44 (e.g. silicon dioxide) is deposited between a semi-transparent metal 46 and a semiconductor 47 (e.g. silicon). A back electrode 48 is an opaque conductor. Metallic electrodes 49 collect the current from the transparent $ZnO_{1-x}F_x$ electrode 42.

A thin-film solar cell 50 shown in FIG. 4 is grown on a glass superstrate 51. A layer of $ZnO_{1-x}F_x$ 52 serves as a transparent conducting electrode contacting a thin p-type amorphous silicon layer 54, which is boron-doped (e.g., $SiH_xB_y$) Current is generated by light absorption in an intrinsic (undoped) amorphous silicon layer 56 (e.g. $SiH_x$). A layer of n-type amorphous silicon 58 (e.g. $SiH_xP_y$) and a metal electrode 59 collect the current at the back of the cell.

Figure 5A:
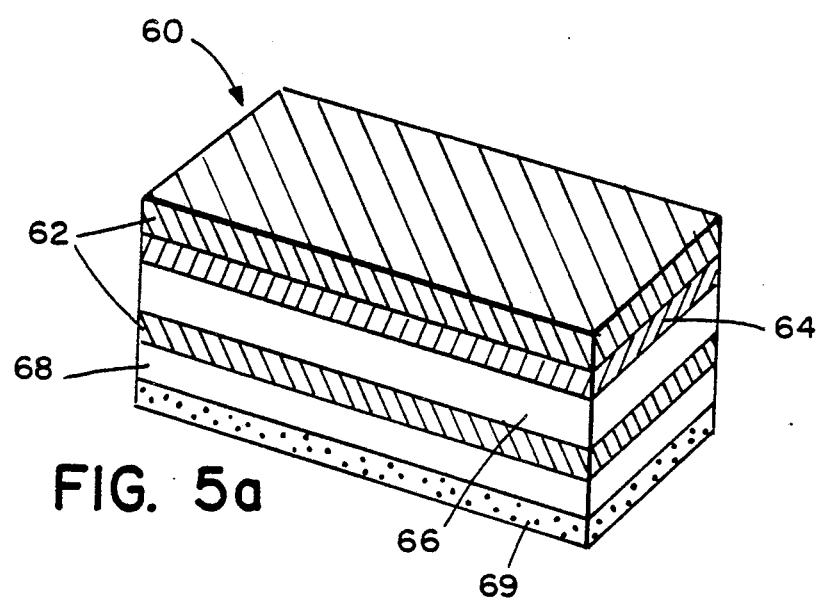
FIG. 5a is a perspective view of an electrochromically adjustable window or mirror incorporating transparent $ZnO_{1-x}F_x$ electrodes.

In a preferred embodiment for an electrochromically adjustable window or mirror 60 (FIG. 5a), a $ZnO_{1-x}F_x$ film 62 provides a transparent electrode contact. Beneath the upper $ZnO_{1-x}F_x$ film 62 is an electrochromically active material 64 e.g. $WO_{3-x}$. A solid ionically conductive material 66 (e.g. $Li_3N$) provides a source of ions, such as lithium ions, which may be pumped into the electrochromically active layer 64 by application of a potential difference across the $ZnO_{1-x}F_x$ film 62 electrodes. This electrochromically adjustable window is supported by a glass substrate 68 in this embodiment of the invention. Addition of a reflective layer 69 forms a mirror whose reflectivity can be adjusted electrically for use, for example in rear view windows of automobiles.

Figure 5B:
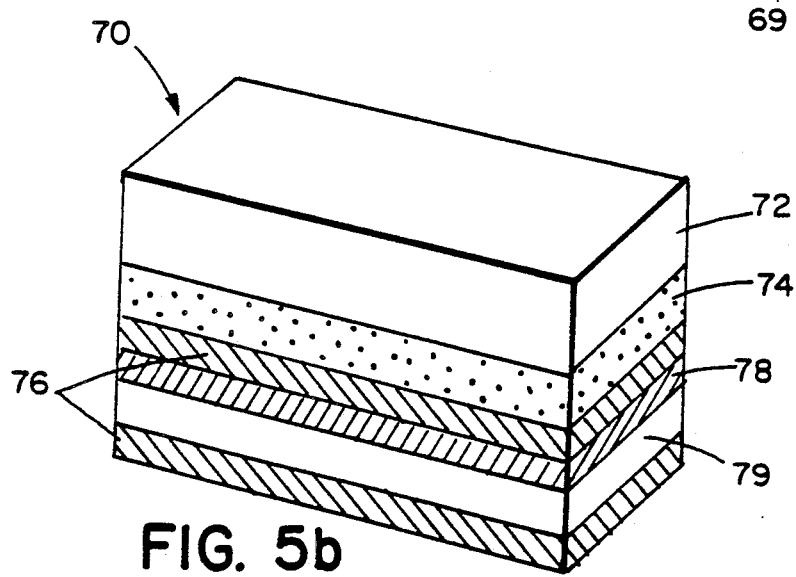
FIG. 5b is a perspective view of an electrochromically adjustable window or mirror incorporating transparent $ZnO_{1-x}F_x$ electrodes and a ZnO film ultraviolet radiation screen.

In another embodiment (FIG. 5b), an electrochromically adjustable device 70 is grown on a glass superstrate 72. A layer of pure ZnO 74 which is a highly efficient absorber of electromagnetic radiation of wavelength less than 370 nanometers absorbs ultraviolet radiation thus protecting the underlying device from damage. A $ZnO_{1-x}F_x$ film 76 provides transparent electrode contacts. Between these $ZnO_{1-x}F_x$ films 76 is an electrochromically active material 78 e.g. $WO_{3-x}$. A solid ionic conductor 79 (e.g. $Li_3N$) provides a source of ions, such as lithium ions, which may be pumped into the electrochromically active layer 78 by application of a potential difference across the $ZnO_{1-x}F_x$ film 76 electrodes.

Although several embodiments of the present invention have been described and illustrated, it will be apparent to those skilled in the art that various changes and further modifications may be made therein without departure from the spirit of the invention or from the scope of the appended claims.

What is claimed is:

1. A compound of the formula $ZnO_{1-x}F_x$ wherein x is in the range 0.001 to 0.1.

2. The compound of claim 1 wherein x is in the range 0.002 to 0.02.

3. The compound of claim 1 wherein x is in the range 0.005-0.01.

4. The compound of claim 1 in the form of a film.

5. Process for making a compound of the formula $ZnO_{1-x}F_x$ wherein x is in the range 0.001 to 0.1 comprising forming a vapor mixture of volatile zinc-containing, oxygen-containing and fluorine-containing compounds; and exposing the vapor mixture to a heated substrate to deposit a film of the compound on the substrate.

6. Process of claim 5 in which said volatile zinc-containing compound is dialkyl zinc, $R_2Zn$, wherein R is a hydrocarbon radical.

7. Process of claim 6 in which said volatile zinc-containing compound is diethyl zinc.

8. Process of claim 6 in which said volatile oxygen-containing compound is an alcohol.

9. Process of claim 8 in which said alcohol is ethanol.

10. Process of claim 6 in which said volatile fluorine-containing compound is a fluorocarbon.

11. Process of claim 10 in which said fluorocarbon is hexafluoropropene.

12. Process of claim 6 in which said volatile fluorine-containing compound is nitrogen trifluoride.

13. Process of claim 6 wherein the film thickness is in the range of 50 to 1000 nanometers.

14. Process of claim 6 wherein the film is polycrystalline.

15. Process of claim 6 sustained at low pressure, 0.001 to 0.01 atmosphere.

16. Process of claim 6 sustained at about atmospheric pressure.

17. Compound of claim 1 which may be patterned using standard photolithographic techniques.

18. Liquid crystal display device incorporating the compound of claim 1.

19. Transparent electrode incorporating the compound of claim 1.

20. Electrochromically adjustable device incorporating the compound of claim 1.

21. Electrochromically adjustable window incorporating the compound of claim 1.

22. Electrochromically adjustable mirror incorporating the compound of claim 1.

* * * * *

UNITED STATES PATENT AND TRADEMARK OFFICE
CERTIFICATE OF CORRECTION

PATENT NO. : 4,990,286

DATED : February 5, 1991

INVENTOR(S) : Roy G. Gordon

It is certified that error appears in the above-identified patent and that said Letters Patent is hereby corrected as shown below:

Column 1, line 18: delete ";".

Column 2, line 9: change "cross sectional" to -- cross-sectional --.

Column 3, line 1: change "C." to -- C --.
           line 30: change "pre heated" to -- pre-heated --.

Column 4, line 30: delete "b".
           line 42: change "p n" to -- p-n --.
           line 42: change "Junction" to -- junction --.

Column 6, line 21: change "6" to -- 5 --.
           line 23: change "6" to -- 5 --.
           line 26: change "6" to -- 5 --.
           line 30: change "6" to -- 5 --.
           line 32: change "6" to -- 5 --.
           line 34: change "6" to -- 5 --.
           line 36: change "6" to -- 5 --.

UNITED STATES PATENT AND TRADEMARK OFFICE
CERTIFICATE OF CORRECTION

PATENT NO. : 4,990,286

DATED : February 5, 1991

INVENTOR(S) : Roy G. Gordon

It is certified that error appears in the above-identified patent and that said Letters Patent is hereby corrected as shown below:

Column 6, line 38: change "6" to -- 5 --.

Signed and Sealed this

Twenty-eighth Day of July, 1992

Attest:

DOUGLAS B. COMER

*Attesting Officer*   Acting Commissioner of Patents and Trademarks